US008764905B1

(12) United States Patent
Zimmerman et al.

(10) Patent No.: US 8,764,905 B1
(45) Date of Patent: Jul. 1, 2014

(54) CLEANING ORGANIC RESIDUES FROM EUV OPTICS AND MASKS

(71) Applicants: Paul A. Zimmerman, Phoenix, AZ (US); Christof G. Krautschik, Santa Clara, CA (US)

(72) Inventors: Paul A. Zimmerman, Phoenix, AZ (US); Christof G. Krautschik, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/827,611

(22) Filed: Mar. 14, 2013

(51) Int. Cl.
*C25F 1/00* (2006.01)

(52) U.S. Cl.
USPC ............. 134/1.1; 134/1.2; 134/21; 134/25.1; 134/26; 134/30; 134/37; 134/902; 216/24; 216/58; 216/66; 250/492.2; 250/504 R

(58) Field of Classification Search
USPC .......... 134/1.1, 1.2, 21, 25.1, 26, 30, 37, 902; 216/24, 58, 66; 250/492.2, 504 R
See application file for complete search history.

(56) References Cited

U.S. PATENT DOCUMENTS

| 7,763,399 | B2 | 7/2010 | Sengupta et al. | |
|---|---|---|---|---|
| 2006/0192158 | A1* | 8/2006 | Wedowski et al. | 250/504 R |
| 2006/0207629 | A1* | 9/2006 | Rastegar et al. | 134/1 |
| 2009/0190105 | A1* | 7/2009 | De Jong | 355/30 |
| 2012/0140196 | A1* | 6/2012 | Banine et al. | 355/67 |
| 2012/0211024 | A1* | 8/2012 | Dietze et al. | 134/1.3 |

OTHER PUBLICATIONS

Extreme Ultraviolet, pp. 1-4 Wikipedia, Jul. 28, 2013.*
Cox et al., "Mechanism of Atmospheric Photooxidation of Organic Compounds. Reactions of Alkoxy Radicals in Oxidation of n-Butane and Simple Ketones", A.E.R.E., Harwell, Oxfordshire OX11 ORA.
"EUV Mask Cleaning Challenges for 16 nm and 11 nm, HP Nodes", Sematech Albany, Oct. 2011.
Kerr et al., "Kinetics of the Reactions of Hydroxyl Radicals and Aldehydes Studied Under Atmospheric Conditions", University of Birmingham.
Moffat et al., "Electrodeposition of Cu on Ru Barrier Layers for Damascene Processing", Journal of the Electrochemical Society, 2006, vol. 152, Issue 1.
Rohatgi et al., "Certification of Vapor Phase Hydrogen Peroxide Sterilization Process for Spacecraft Application", 2001 Society of Automotive Engineers, Inc.
Liberman et al., "Laser Photocontamination During High Index Fluid Exposure: Mechanisms and Remediation Strategies", Sematech—MIT Lincoln Library.
Zacharia, "Desorption of Gases from Graphitic and Porous Carbon Surfaces", im Fachbereich Chemie der Freien Universitat Berlin eingereichte Dissertation, 2004.
"Vapor Pressures", US Peroxide, Technologies for a clean environment, downloaded from http://www.h2o2.com/technical-library/physical-chemical-properties/physical-properties/default.aspx?pid=25&name=Vapor-Pressures.

(Continued)

*Primary Examiner* — Bibi Carrillo
(74) *Attorney, Agent, or Firm* — Grossman, Tucker, Perreault & Pfleger, PLLC

(57) ABSTRACT

A method and system for cleaning lithography components including contacting a substrate having residue including organic compounds and graphitic carbon deposited on a surface thereof with hydrogen peroxide vapor. The hydrogen peroxide vapor is irradiated with electromagnetic radiation having a wavelength in the range of 100 nm to 350 nm forming hydroxyl radicals. The hydroxyl radicals react with the residue to remove the residue from the surface of the substrate.

17 Claims, 8 Drawing Sheets

(56) References Cited

OTHER PUBLICATIONS

Jones, C.W., "Applications of Hydrogen Peroxide and Derivatives", Royal Society of Chemistry.

Tong, et al., "Semiconductor Wafer Bonding: Science and Technology", The Electrochemical Society, Inc., Pennington, New Jersey.

Chameides, et al., "Chemistry in the Troposphere", C&EN Oct. 4, 1982.

Wang, et al., "Hydroxyl Radial Concentrations Measured in Ambient Air", Science, 1975.

* cited by examiner

1) $\bullet OH + R \rightarrow R\bullet + H_2O$

2a) $\bullet OH + R\bullet \rightarrow ROH$ Or

2b) $\bullet OH + R\bullet \rightarrow R'CH = CH_2 + H_2O$

3) $\bullet OH + R'CH = CH_2 \rightarrow R'\overset{\bullet}{\underset{H}{C}}\overset{H}{\underset{H}{C}}OH$ 4) $\bullet OH + R'\overset{\bullet}{\underset{H}{C}}\overset{H}{\underset{H}{C}}OH \rightarrow R'\overset{OH}{\underset{H}{C}}\overset{H}{\underset{H}{C}}OH$

CLEANING ORGANIC RESIDUES FROM EUV OPTICS AND MASKS

FIELD

The present disclosure relates to the cleaning of organic and graphitic carbon residues from extreme ultraviolet (EUV) lithography optics and masks.

BACKGROUND

A common method of forming structures on wafers or other substrates in the semiconductor industry is lithography. In lithography, features are formed by the addition or removal of material on a substrate surface. In general, lithography proceeds by coating a surface with a resist. Light is projected onto the resist through a mask, exposing portions of the resist to the projected light and patterning the resist. Depending on the resist, the light causes alterations in the chemical structures of the resist, which upon the application of a developer either allows the exposed portions of the resist to be removed or prevents the exposed portions of the resist from being removed. Once a portion of the resist is removed, the exposed substrate surfaces may be etched.

Perceived limitations in photolithography, including the optical diffraction limit, spurred the development next-generation lithography techniques, including extreme ultraviolet lithography (EUV), which utilizes electromagnetic radiation having wavelengths in the range of 10 nm to 124 nm, including all values and ranges therein. In one form of extreme ultraviolet lithography, plasma is formed from xenon. In generating the plasma, electrons are liberated, and the plasma radiates light at wavelengths of approximately 13 to 14 nanometers. The light interacts with various optics, such as one or more condensers, lenses, and mirrors, and is projected onto a mask (which may be formed on a mirror) and reflected onto a resist coated workpiece, such as a wafer. The process is performed under relatively high vacuum conditions as all matter absorbs extreme ultraviolet light radiation.

The resist is commonly formed from compositions that include organic compounds. For example, resist formulations may include a resin, a solvent, a photoacid generator and a quencher. Any of the formulation components may include organic compounds. Even in resists that are inorganic or include inorganic compounds, such as hafnium oxide sulfate ($HfSO_x$) or photosensitive metal organic oxides, organic compounds may be present. During processing, the organic compounds, or derivatives thereof, may be fragmented and thus liberated due to outgassing (or off gassing) and other effects. The organic compounds may then be deposited onto the lens, mask, and other surfaces of the extreme ultraviolet optics and masks. This residue build up may cause defects in the optics and mask that may negatively affect the performance of the process.

However, there are many difficulties in obtaining relatively effective cleaning solutions for extreme ultraviolet lithography components including lack of infrastructure and inspection ability and the need for further tool and process development. Furthermore, extreme ultraviolet surface materials, such as absorber, anti-reflective coatings and capping layers on the masks are not fully established, making it difficult to target specific cleaning chemistries. In addition, there are few suppliers and the market is relatively small leading to a general lack of market force behind the development of solutions.

BRIEF DESCRIPTION

The above-mentioned and other features of this disclosure, and the manner of attaining them, may become more apparent and better understood by reference to the following description of embodiments described herein taken in conjunction with the accompanying drawings, wherein:

FIG. 4 illustrates embodiments of oxidation reaction mechanisms using hydroxyl radicals;

DETAILED DESCRIPTION

As discussed above, extreme ultraviolet lithography utilizes electromagnetic radiation having wavelengths in the range of 10 nm to 124 nm, including all values and ranges therein. In one form of extreme ultraviolet lithography, plasma is formed, for example, from xenon or tin.

In generating the plasma, electrons are liberated, and the plasma radiates light at wavelengths of, for example, 13 to 14 nanometers. The light interacts with various optics, such as one or more condensers, lenses, and mirrors, and is projected onto a mask (which may be formed on a mirror) and reflected onto a resist coated workpiece, such as a wafer. The process is performed under relatively high vacuum conditions as all matter absorbs extreme ultraviolet light radiation and contaminants within the system may cause defects.

The resist is commonly formed from compositions that include organic compounds. For example, resist formulations may include a resin, a solvent, a photoacid generator and a quencher. Any of these formulation components may include organic compounds. Even in resists that are inorganic or include inorganic compounds, such as hafnium oxide sulfate ($HfSO_x$) or photosensitive metal organic oxides, organic compounds may be present, particularly as solvents. During processing, the organic compounds, or fragments thereof, may be liberated due to outgassing in vacuum (or off gassing) and other effects. Some of the components that may outgas include formic acid, formaldehyde, methanol, ethanol, propanol, acetone and acetaldehyde. The volatized organic compounds may then be deposited onto the lens, mask, and other surfaces of the extreme ultraviolet lithography system. Upon further exposure to extreme ultraviolet radiation where these species are deposited further degraded or graphitic carbon is formed. This residue may cause defects in the optics and mask that may negatively affect the performance of the process.

Figure 1:
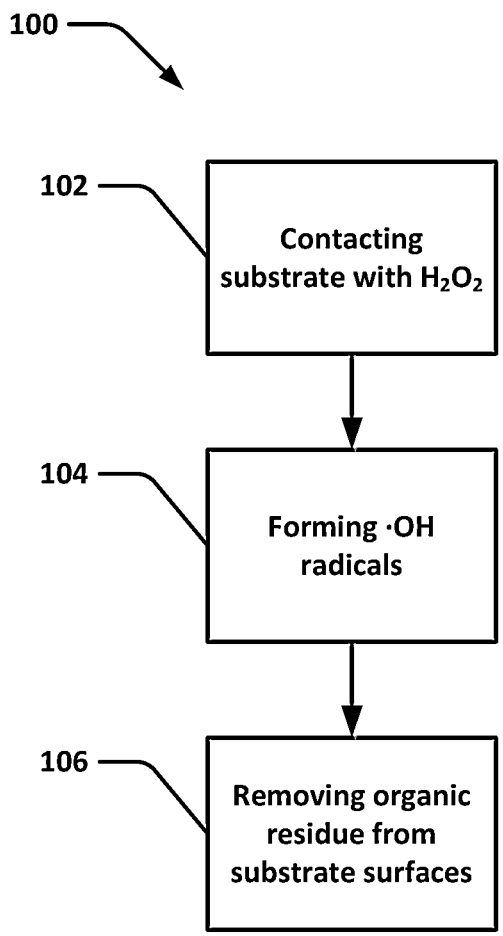
FIG. 1 illustrates a flow chart of an embodiment of a method of cleaning substrates.

The present disclosure relates to methods and system for optics, including masks, mirrors, lenses and other components used in next generation lithography systems, including the extreme ultraviolet lithography systems discussed above. As illustrated in FIG. 1, the method 100 generally involves contacting a substrate, such as an extreme ultraviolet lithography mask, having residue including organic compounds and graphitic carbon on a surface with hydrogen peroxide ($H_2O_2$) vapor 102. The $H_2O_2$ vapor is irradiated with electromagnetic radiation 104 having a wavelength in the range of 100 nm to 350 nm to remove the residue from the surface of the substrate 106. The H₂O₂ vapor forms hydroxyl radicals (.OH), which react with the residue including organic compounds and graphitic carbon, via oxidation, until the residue forms volatile organic compounds and is removed from the surface of the substrate.

Figure 2:
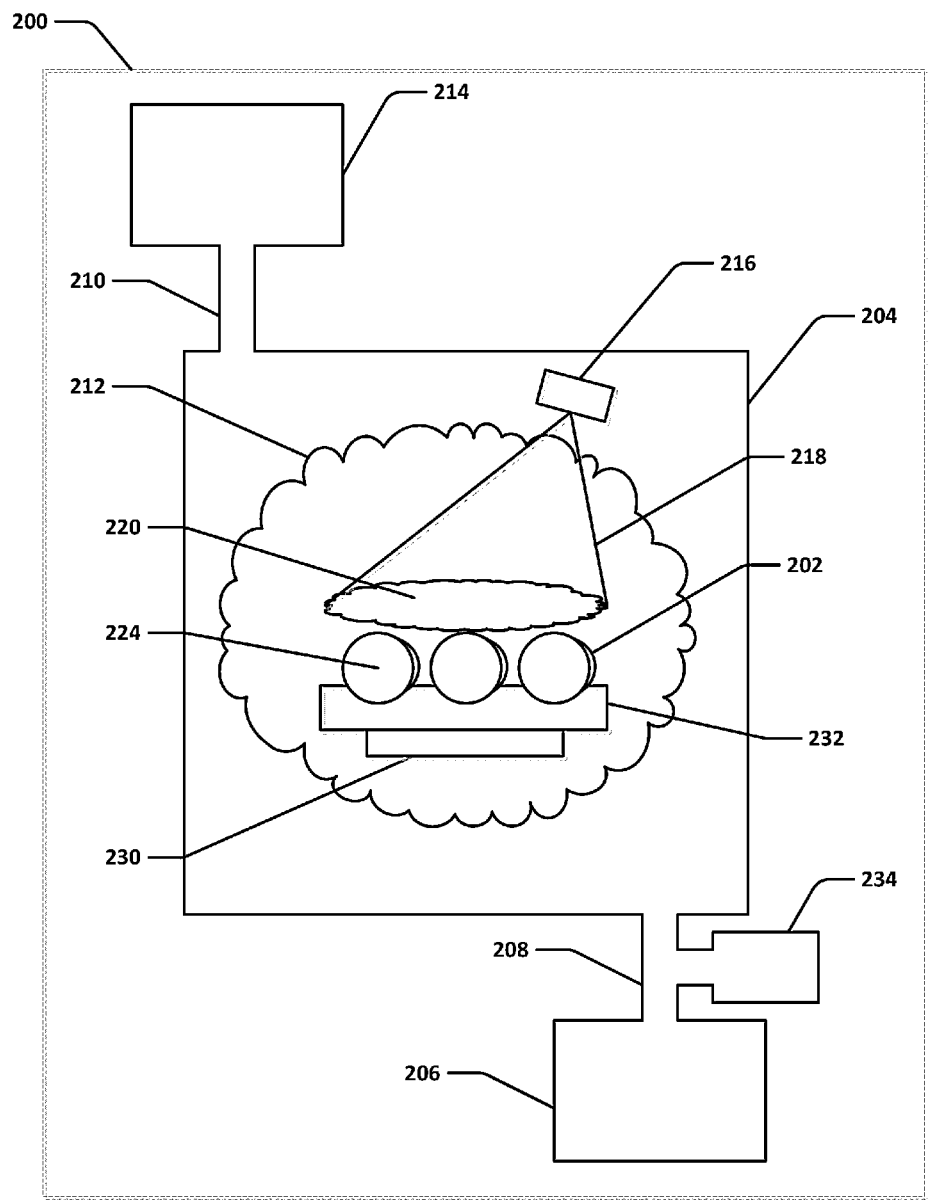
FIG. 2 illustrates a schematic of a system for cleaning substrates.

An embodiment of the method and a system for cleaning lithography components is illustrated schematically in FIG. 2. Substrates, including optical lithography components 202, are positioned within a vacuum chamber 204. The vacuum chamber 204, may optionally be part of a lithography system 200, such as an extreme ultraviolet lithography system or other next generation lithography system. In embodiments, the lithography system is a system that utilizes a vacuum to remove particles and contaminants from the path of electromagnetic radiation that passes through the system. Transfer of the lithography optics into the vacuum chamber occurs from a vacuum chamber connected to the lithography tool allowing transfer of the components without breaking the vacuum in the system.

Using one or more vacuum pumps 206 in fluid communication with the vacuum chamber 204 through an outlet 208, the vacuum chamber is evacuated to a pressure in the range of $10^{-6}$ to $10^{-3}$ Torr. The vacuum pumps 206 include, for example, a momentum transfer pump and a positive displacement pump for initial evacuation and support of the momentum transfer pump. Fluid communication is understood as the ability of a fluid, and in particular, a gas to pass from one portion of the system to another portion of the system. Fluid communication is established using one or more of the following: pipes, valves, flow control meters and other devices including associated control systems and control logic.

H₂O₂ is supplied into the vacuum chamber 204 from a reservoir 214. While as illustrated, the H₂O₂ is provided into the vacuum chamber 204 as a vapor, the H₂O₂ may alternatively be converted into a vapor within the chamber. When supplied into the vacuum chamber 204 as a vapor 212 the H₂O₂ is stored as a liquid and converted into the vapor phase prior to entering the vacuum chamber 204. The partial pressure of the H₂O₂ is in the range of 0.5% of atmosphere to 2% of atmosphere, including all values and ranges therein. In embodiments, at 20° C., a partial pressure of 5 torr of hydrogen peroxide can be volatized in the vacuum.

The H₂O₂ is pumped into the vacuum chamber 204 at a flow rate of 5 to 100 sccm, including all values and ranges therein such as in the range of 20 sccm to 100 sccm, 50 sccm to 100 sccm, etc. In embodiments, a carrier gas is also provided into the vacuum chamber and, similar to the H₂O₂, is stored in a reservoir and supplied into the vacuum chamber 204 through the inlet 210. The carrier gas may include an inert gas such as nitrogen or argon. The pressure within the vacuum chamber 204 is maintained in the range of $10^{-4}$ to $10^{-1}$ Torr, including all values and ranges therein when the H₂O₂ is provided in the chamber.

The H₂O₂ is irradiated or exposed to a light source 216 that emits electromagnetic radiation 218 having a wavelength in the range of 100 nm to 350 nm, including all values and ranges therein, such as 100 nm to 300 nm, 100 nm to 220 nm, 148 nm, 157 nm, 184 nm, etc. The light source 216 may include, for example, low pressure mercury lamps, excimer lamps including one or more of the following sources: Xe₂, KrCl, KrF, ArF, D₂, and F₂. The interaction of the light (electromagnetic radiation) with the hydrogen peroxide vapor 212 forms hydroxyl radicals (.OH) 220 proximal to the surfaces 224 to be cleaned such that the surfaces are contacted by the hydroxyl radicals (OH). The decomposition of the hydrogen peroxide into hydroxide radicals is illustrated in Eq. 1 below, wherein λ is a wavelength and hυ indicates the presence of light.

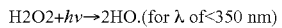

Eq. 1

Various residues that are deposited on the lithography components (substrates) include various organic compounds and graphitic carbons. Organic compounds may be understood to include hydrocarbons. The hydrocarbons include, for example, substituted or unsubstituted hydrocarbons, such as CH₄ to C₆₄H₈₄ having a weight average molecular weight in the range of 14 to 1000, including all values and ranges therein, such as 14 to 854, etc. Graphitic carbon is understood to include substances consisting of carbon having three-dimensional hexagonal crystalline structure having relatively long-range order of 50 nm and above. In embodiments, the volatile compounds removed through vacuum evacuation during the process are collected in a trap 234 in fluid communication with the outlet 208. Under exposure of the electromagnetic radiation, the organic compounds may undergo direct photolysis and degrade to graphitic carbon as well as undergo photolytic polymerization. However, the hydroxyl radicals react with these by-products of the irradiation process as well.

As noted above, these residues are generated from materials used in the lithography process, and particularly from the photoresists, which form volatile compounds due to the high vacuum environment and exposure to extreme ultraviolet during the lithography process. EUV photoresists include organic solvents, such as one or more of the following: propylene glycol monomethyl ether (PGME), propylene glycol monomethyl ether acetate (PGMEA), ethyl lactate, methyl s-hydroxybutyrate (HBM), cyclohexanone, heptanone, lactone etc. In addition, the EUV photoresist includes a polymer resin such as an acrylate, a cyclo-olefin methacrylate, or a cyclo-olefin acrylate. The resin is used in combination with a photo acid generator that may include monophenyl sulfonium salt or triphenyl sulfonium salt and a quencher that may include hydrogen chloride or water as well as compositions that include alcohols, ethyls, esters, ketones, amines such as trioctylamine, aldehydes, phenols, cyanides, flourides bromides, oxos or nitros.

Alternatively or in addition to resin containing photoresists, photoresists including inorganic compounds are used during EUV lithography. For example, HfOx and ZrOx have organic moieties and are delivered onto the substrate in an organic solvent carrier by methods such as spin casting. However, many of these compositions are provided in organic solvents that contribute to residue formation.

Figure 3:
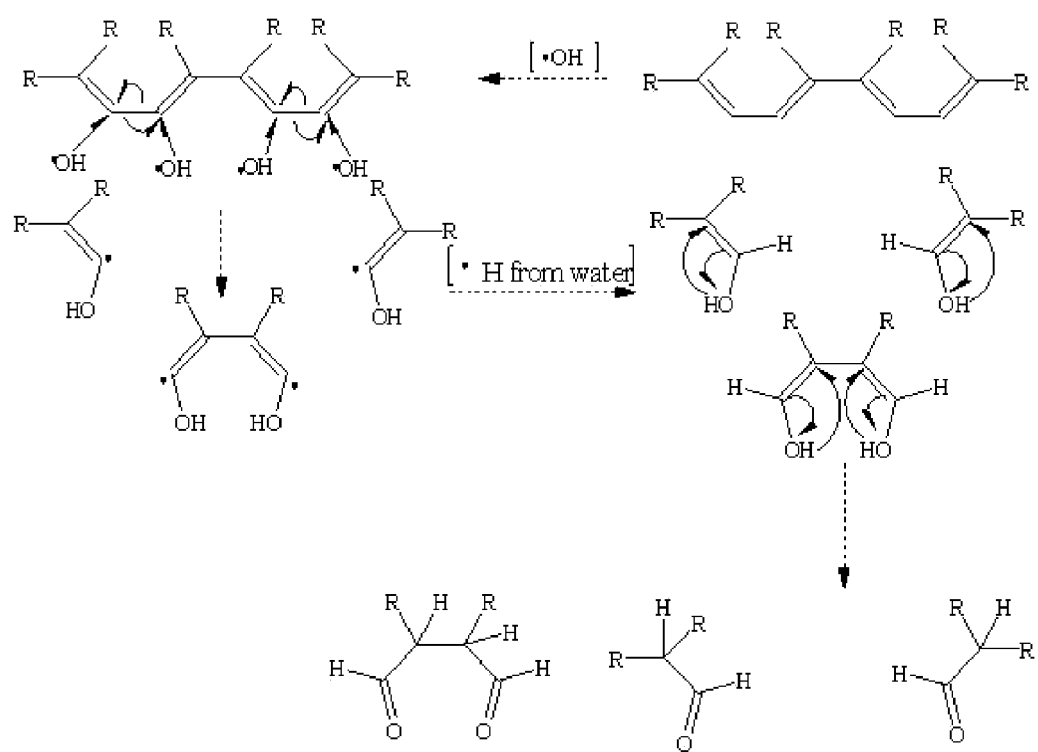
FIG. 3 illustrates an embodiment of an oxidation reaction mechanism using hydroxyl radicals.

The hydroxyl radicals, formed when the hydrogen peroxide is irradiated, oxidize the organic and graphitic carbon species until the species are relatively polar and volatile enough to be removed by the, vacuum, carrier gas or subsequent washing. Without being bound to any particular reaction mechanism, representative reaction mechanisms for the oxidation of hydrocarbons and graphitic carbon in the residue is provided in FIGS. 3 and 4. In FIG. 3, R is any chemical species that is present in the organic film. Non-limiting examples of organic species include alkanes, alkenes or, alkynes. Each R is a different chemical species or two or more R's are the same chemical species. As illustrated in reactions mechanisms 1 through 4 depicted in FIG. 4, R includes, for example, alkanes or alkenes, such as substituted or unsubstituted C₁ through C₆₄ alkanes or alkenes, such as $C_xH_{2x+1}$ or $C_xH_{2x}$, wherein x is in the range of 1 to 64. The residues may have a molecular weight Mw (weight average) in the range of 14 to 1000 including all values and ranges therein, such as 14 to 854. Each R is a different chemical species or two or more R's are the same chemical species. As seen in FIGS. 3 and 4, oxidation continues until the compounds become polar volatile organic compounds that are removed through vaporization and vacuum evacuation or washing in a high purity polar solvent. Additional reactions may occur in addition to those described above. The presence of $C_xF_{2x+1}$ offers little, if any, resistance to the cleaning mechanism.

The reaction time is in the range of 10 seconds to 480 minutes, including all values and ranges therein, such as 60 seconds to 360 minutes, 10 minutes to 30 minutes, 30 minutes to 60 minutes, 60 minutes to 120 minutes, etc. The concentration of the hydrogen peroxide (in water) is in the range of 0.01% by weight to 30% by weight of the total weight of the solution, including all values and ranges therein, such as 0.1%, 1%, 3%, 6%, 10%, etc. The total electromagnetic radiation dose is in the range of 5 J/cm² to 300 J/cm², including all values and ranges therein, such as 5 J/cm² to 140 J/cm². In addition, the vacuum chamber is maintained at a temperature in the range of 20° C. to 150° C., including all values and ranges therein. In embodiments, the vacuum chamber is maintained at a temperature of 100° C. to 150° C. and 100° C. to 120° C. Maintaining the temperature above 100° C. may help prevent undesirable condensation of peroxide or water on cleaned surfaces. Temperatures are maintained by heaters positioned in the vacuum chamber (see heaters 230 in FIG. 1) that are provided on the substrate table (see substrate table 232 in FIG. 1) or around the vacuum chamber 204. Control of the substrate temperature and flow of hydrogen peroxide may deliver hydroxyl radials to particular areas of interest.

Substrates that are processed using the methods described above include various optical components that may be utilized in the lithography system. These components include, for example, condensers, lenses, mirrors, and masks. In embodiments, the substrate comprises an lithography mask, such as an extreme ultraviolet lithography mask. The substrates are formed from materials such as silicon, silica, doped silica, fused silica, aluminum stainless steel, steel alloys, copper, zinc and titanium, etc. In embodiments, the substrates may include doped materials, such as Ti-doped fused silica. These substrates may form a passivation layer, protecting the substrate and improving compatibility of cleaning. In addition or alternatively, the substrates also include one or more of the following: Ru, MoSi, CrN, TaNO/TaBO, TaNO/TaN, SiCN, SiON, TiN, TaN and HfO. The substrates, whether they include the noted compositions or not, may also exhibit an etch rate of less than 5 nm/minute relative to the OH radicals.

Figure 5:
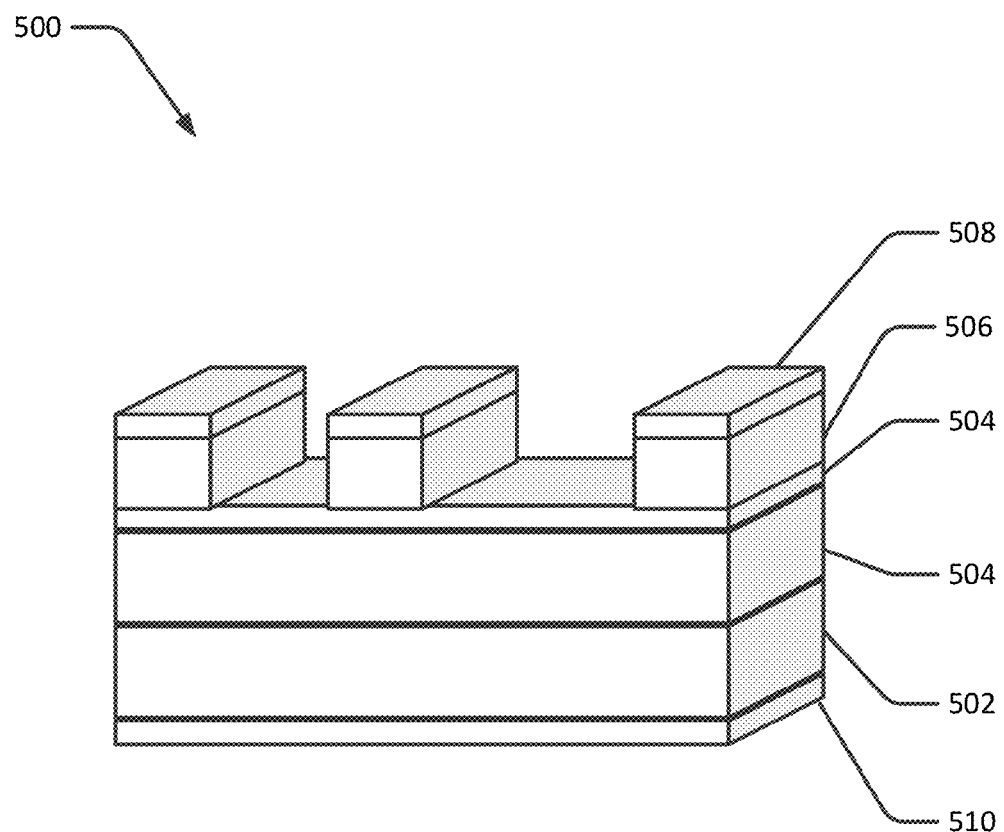
FIG. 5 illustrates an embodiment of a substrate cleaned using the methods described herein.

A non-limiting embodiment of a substrate used in the method herein is an extreme ultraviolet lithography mask illustrated in FIG. 5. The mask 500 includes a low thermal expansion material substrate (LTEM) 502 upon which on or more reflective layers 502 are formed on top of. These reflectors act may act as a Bragg mirror for the EUV electromagnetic radiation. A capping layer 504 is provided over the reflective layers as a protecting layer for the reflective layers. In addition, one or more absorber stacks 506 are formed on the capping layer defining the pattern that is reflected onto a wafer. An anti-reflective coating 508 is formed on the absorber stacks 506. A conductive backside layer 510 is optionally deposited on the opposing surface on which the reflective layers are deposited on. The conductive back layer 510 allows for electrostatic chucking of the mask.

In embodiments, the LTEM substrate is formed from glass, such as Ti-doped fused silica having a thickness in the range of 6.0 mm and 7.00 mm. The reflective layers are formed of MoSi bilayers and include 40 to 50 bilayers having a thickness of 3 to 4 nm each, resulting in a total thickness in the range of 250 nm to 350 nm. One or more capping layers are provided and are formed from Ru, Si or both Ru and Si. Ru, when present, is provided at a thickness in the range of 3.0 nm to 4.0 nm. Si when present is present at a thickness of 4.0 nm. The total thickness of the capping layer may be from 2 to 4 nm.

The absorber stacks are formed from a number of materials, including one or more of the following, TaBO, TaBN, TaNO, TaN, Cr. The total thickness of the absorber stack is in the range of 50 nm to 75 nm. The anti-reflective coating is formed of HfO2 or SiON. When formed of HfO2, the anti-reflective coating has a thickness of less than 10 nm. When formed from SiON, the anti-reflective coating has a thickness of greater than 10 nm. The total anti-reflective coating layer has a thickness in the range of 7 nm to 15 nm. The conductive backside layer is formed of a material, such as CrN and has a thickness in the range of 70 nm to 100 nm.

As noted above, other substrates include mirrors. Similar to a mask, the mirror includes a fused silica, quartz, lithium aluminosilicate glass-ceramic, titania-silica binary glass with zero CTE LTEM. In addition, reflective layers are formed on the LTEM, including Mo/Si, palladium, ruthenium, rhenium and combinations thereof. The total thickness of the LTEM is in the range of 6.0 mm to 7.0 mm and the total thickness of the reflective layers is in the range of 250 to 250 nm. Substrates also include lenses, such as silica ($SiO_2$) lenses.

In addition, the substrates are formed of materials that exhibit an etch rate of 5 nm per minute or less when exposed to hydroxyl radicals, such as all values and ranges from 0.1 nm per minute to 5 nm per minute. In embodiments, the etch rate is less than 0.1 nm per minute, or 0 nm per minute. The hydroxyl radicals may form a passivation layer on the surfaces, which is either 1) thermodynamically unstable at the temperatures used during the process or 2) could be reduced to the original state with $H_2$. For example, while SiOH and RuOH are formed in monolayers these compositions are reduced back to the initial states as shown in Eqs. 2 and 3 below.

$$RuOH + H^+ + e^- \rightarrow Ru + H2O \qquad \text{Eq. 2}$$

$$2SiOH \rightarrow Si\!-\!O\!-\!Si + H2O \qquad \text{Eq. 3}$$

The process also induces little, if any, additional surface roughness.

Also provided herein are substrates, including various extreme ultraviolet lithography components that are treated by the methods in the systems described above.

EXAMPLES

It is contemplated that the following example is informative of processes described above.

Figure 6:
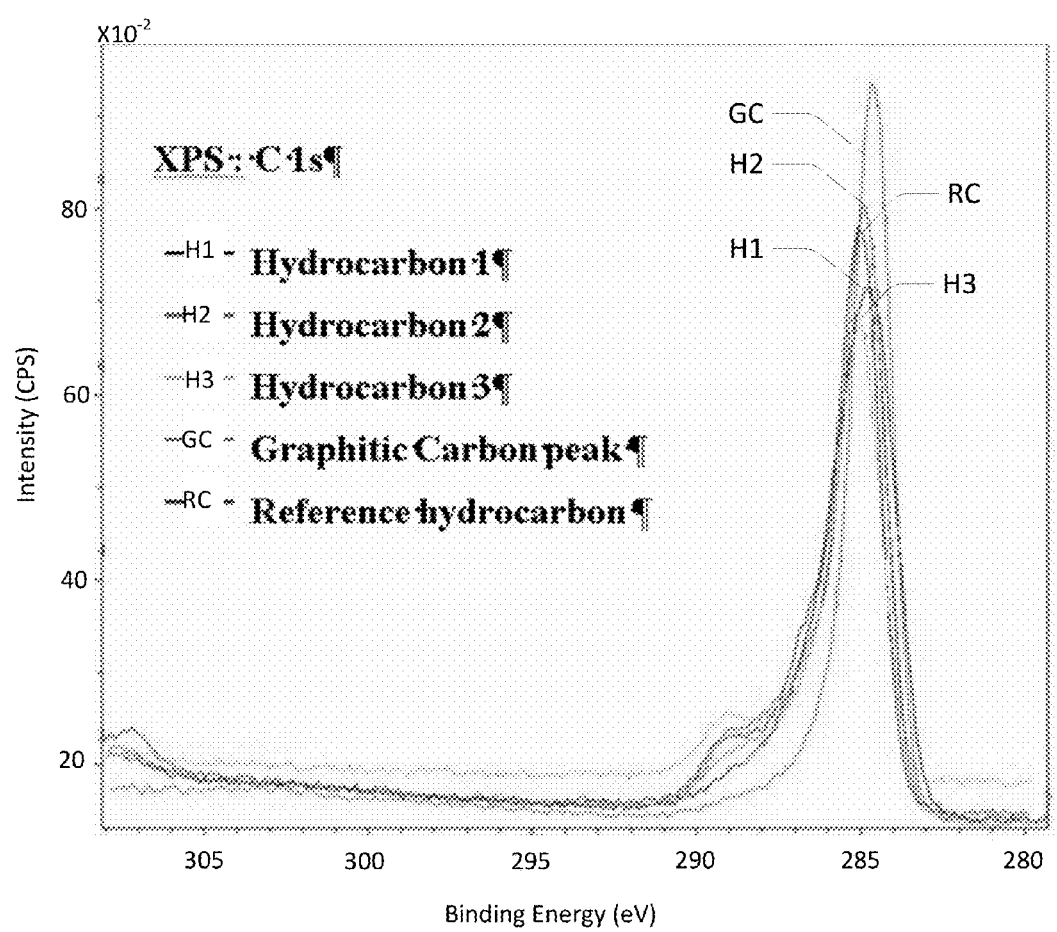
FIG. 6 illustrates an x-ray photoelectron spectroscopy analysis of residue deposited on a substrate.

Using X-ray photoelectron spectroscopy (XPS), the residue on a $SiO_2$ lens used during 193 nm immersion lithography was analyzed and the results are illustrated in FIG. 6. The residue was built up on the lens overtime from the degradation of organic species during normal use of the lithography tool. In this case $C_6H_{12}$ was used to build up the contamination layers and to evaluate the cleaning approach. It was determined that organic and graphite carbon was deposited on the substrate during extended exposure to the 193 nm UV light. The XPS also detected the presence of various hydrocarbons including $CH_4$ to $C_{64}H_{84}$ on the $SiO_2$ lens substrate.

Figure 7:
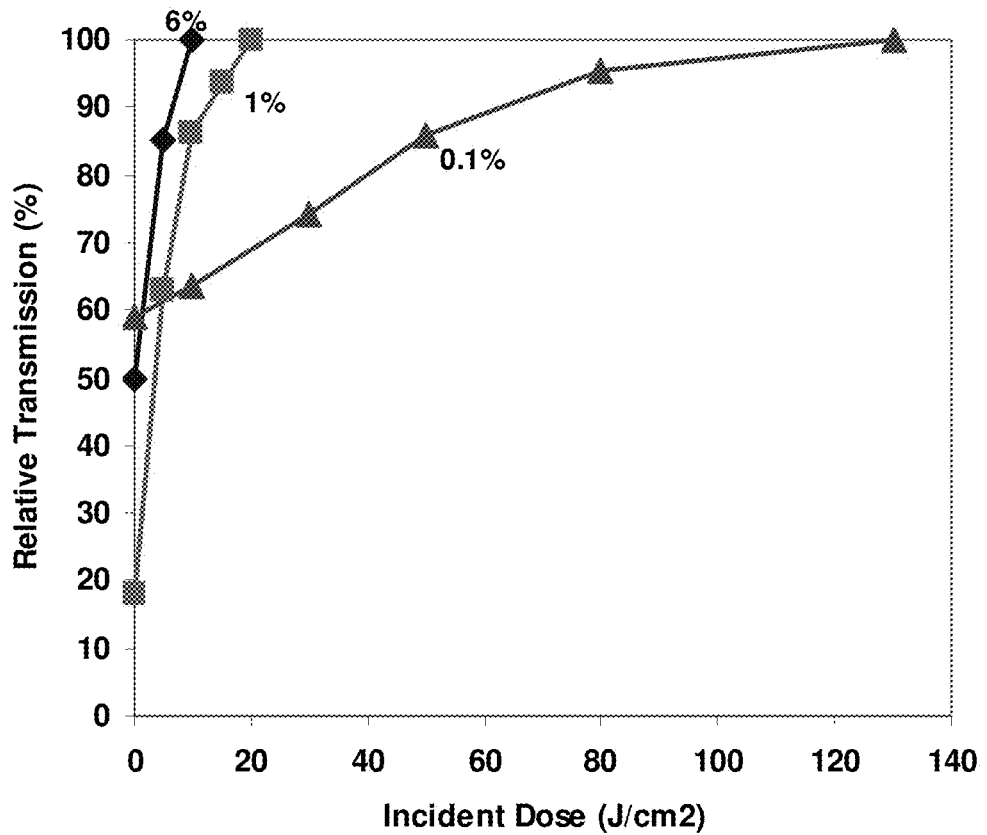
FIG. 7 illustrates the effect of dosage on relative transmission of substrates treated with various concentrations of hydrogen peroxide.

Based on the above, hydrocarbons and graphitic carbon were deposited on a $SiO_2$ (quartz) substrate. This material was selected so as to allow monitoring of cleaning and removal through UV transmission spectroscopy through the quartz substrate. The substrate was placed into a flow through chamber, wherein $H_2O_2$ in solution was degraded to OH radicals during exposure to 193 nm ultraviolet light. Cleaning time in this case for removing the deposited hydrocarbons and graphitic carbon was observed as being less than 60 seconds. The progression of cleaning as a function of peroxide concentration (% of total volume in water) was monitored using UV transmission spectroscopy, wherein an increase in transmission indicates removal of residue from the substrate. FIG. 7 illustrates an increase in transmission verses dosage (i.e., 193 nm radiant exposure), which reflects that as $H_2O_2$ concentration increased a lower incident dose was required to achieve 100% relative transmission.

Figure 8:
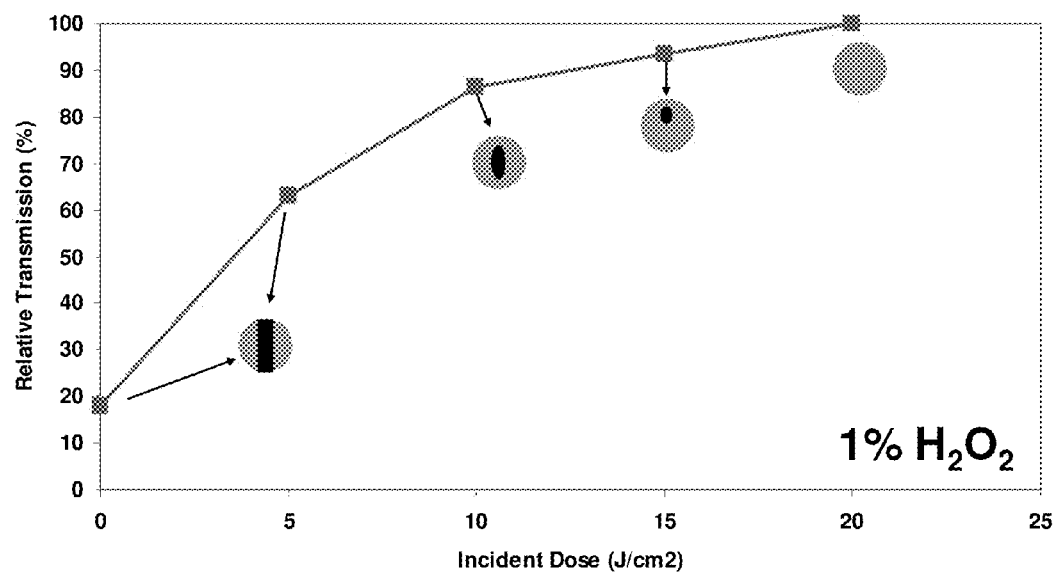
FIG. 8 illustrates the cleaning observed and relative transmission measured on a substrate as electromagnetic radiation dose increases.

Using lower (1%) concentrations of $H_2O_2$ allowed for the real-time monitoring of cleaning progression using 193 nm ArF laser transmission through the $SiO_2$ lens. FIG. 8 illustrates the amount of cleaning versus time for a sample in 1% $H_2O_2$. As can be seen as the dosage increases, (cumulative), the percent (%) of relative transmission increases. Furthermore, the circles are pictorial representations of cleaning of the graphitic spots as actually observed in transmission during cleaning. As depicted, the graphitic spots are reduced in size and gradually disappear.

Unlike in the process described in the example above, next generation lithography techniques are generally performed under vacuum. The various system components and processes are more adversely affected by the presence of contaminants on the masks, optics and within the system, by creating defects in the resulting workpieces. In addition, the optics are sensitive to condensation of water on the surfaces of the substrates (optics), eliciting adverse chemical reactions that may ultimately cause defects. Furthermore, the action of a hydrogen peroxide solution against the components may negatively impact the features on the optics and particularly those on the masks.

Accordingly, an aspect of the present disclosure relates to a method of cleaning lithography optic components. The method includes supplying $H_2O_2$ into a chamber under vacuum containing substrates including one or more surfaces having a residue deposited on the surface, wherein the $H_2O_2$ is in the vapor phase and the residue includes organic compounds and graphitic carbon. The $H_2O_2$ is exposed to electromagnetic radiation having a wavelength in the range of 100 nm to 350 nm and hydroxyl radicals are formed. The method further includes oxidizing the residue and forming volatile organic compounds as well as removing the volatile organic compounds from the substrate.

In any of the above embodiments, the chamber is at a chamber temperature in the range of 20° C. to 150° C. and preferably in the range of 100° C. to 150° C. and in particular embodiments in the range of 100° C. to 120° C. Further, in any of the above embodiments, the electromagnetic radiation has a wavelength in the range of 100 nm to 220 nm and in particular embodiments of the above in the range of 150 nm to 200 nm and in particular embodiments 193 nm. In addition, in any of the above embodiments, the electromagnetic radiation is provided at a dosage in the range of 5 $J/cm^2$ to 140 $J/cm^2$.

In any of the above embodiments, the substrate includes Ti-doped fused silica. In addition, or alternatively, in any of the above embodiments, the substrate comprises one or more of the following: Ru, MoSi, CrN, TaNO/TaBO, TaNO/TaN, SiCN, SiON, TiN, TaN and HfO. Further, in addition, or alternatively, in any of the above embodiments, the substrate exhibits an etch rate of less than 5 nm/minute relative to the hydroxyl radicals. In particular embodiments of the above, the substrate comprises an extreme ultraviolet lithography mask.

In any of the above embodiments, the substrate includes Ti-doped fused silica. In addition, or alternatively, in any of the above embodiments, the substrate comprises one or more of the following: Ru, MoSi, CrN, TaNO/TaBO, TaNo/TaN, SiCN, SiON, TiN, TaN and HfO. Further, in addition, or alternatively, in any of the above embodiments, the substrate exhibits an etch rate of less than 5 nm/minute relative to the hydroxyl radicals. In particular embodiments of the above, the substrate comprises an extreme ultraviolet lithography mask.

Another aspect of the present disclosure relates to a method of cleaning lithography optic components. The method includes contacting a substrate having residue disposed on a surface of the substrate with $H_2O_2$ vapor, wherein the residue includes organic compounds and graphitic carbon. The method also includes irradiating the $H_2O_2$ vapor with electromagnetic radiation having a wavelength in the range of 100 nm to 350 nm and removing the residue from the surface. Upon irradiating the $H_2O_2$ forms hydroxyl radicals and the hydroxyl radicals oxidize the residue.

In any of the above embodiments, the substrate is provided in a vacuum having a pressure in the range of $10^{-4}$ to $10^{-1}$ Torr. In addition, in any of the above embodiments, the substrate is maintained at a temperature in the range of 20° C. to 150° C. and in embodiments in the range of 100° C. to 150° C. and in particular embodiments in the range of 100° C. to 120° C. Furthermore, in any of the above embodiments irradiating the $H_2O_2$ forms hydroxyl radicals and the hydroxyl radicals attach to and oxidize the residue. In any of the above embodiments, the electromagnetic radiation has a wavelength in the range of 100 nm to 220 nm and in embodiments in the range of 150 nm to 200 nm and in particular embodiments 193 nm. In any of the above embodiments, electromagnetic radiation is provided at a dosage in the range of 5 $J/cm^2$ to 140 $J/cm^2$.

In any of the above embodiments, the $H_2O_2$ is supplied at a concentration in the range of 1% to 30% by weight in water. Further, in any of the above embodiments, the substrate is provided in a vacuum having a pressure in the range of $10^{-4}$ to $10^{-1}$ Torr. In addition, in any of the above embodiments, the $H_2O_2$ with a carrier gas. In addition, in any of the above embodiments where a carrier gas is provided, the carrier gas is an inert gas. In embodiments, laminar flow of the $H_2O_2$ vapor and optional carrier gas (eg., Ar, N2) is established over areas of interest in the optical substrates, for example, where contamination is particularly heavy.

In any of the above embodiments, the substrate includes Ti-doped fused silica. Furthermore, in any of the above embodiments, the substrate includes one or more of the following: Ru, MoSi, CrN, TaNO/TaBO, TaNO/TaN, SiCN, SiON, TiN, TaN and HfO. In any of the above embodiments, the substrate exhibits an etch rate of less than 5 nm/minute relative to the hydroxyl radicals. In particular embodiments of the above, the substrate includes an extreme ultraviolet lithography mask.

A further aspect of the present disclosure relates to a system for cleaning lithography optic components according to any of the above embodiments of the methods described above. The system includes a vacuum chamber, a substrate holder positioned within the vacuum chamber, an emitter of electromagnetic radiation having a wavelength in the range of 100 nm to 350 nm, a vacuum pump in fluid communication with the vacuum chamber, and an $H_2O_2$ reservoir in fluid communication with the vacuum chamber. In addition in embodiments, the system includes a trap in communication with the vacuum pump. Further, in any of the prior embodiments, the system further includes a heater to heat the vacuum chamber to a temperature in the range of 100° C. to 150° C.

In utilizing the vacuum chamber as part of a lithography system, the optical components may be transitioned into the vacuum chamber for cleaning without breaking the vacuum, reducing pump down times and production down time. Furthermore, by making such a transition without breaking vacuum, less contaminant enters the system that would otherwise be introduced by removing the optics and reintroducing the optics into the lithography system.

Yet a further aspect of the present disclosure relates to an optical component for lithography prepared according to any of the above methods. In addition, in embodiments, the optical component is prepared in the above system.

The methods and processes herein provide relatively simple, rapid, safe and cost effective methods for cleaning relatively difficult to remove residues. For example, presently available processes, such as the high temperature hydrogen cleaning process requires a relatively longer process time due to the competitive process between the formation of atomic hydrogen and recombination to molecular hydrogen. In addition, the approach produces relatively low toxicity by-products while removing unwanted organics at a relatively rapid rate. Further, the approach may result in relatively less damage of other surfaces of the extreme ultraviolet components as compared to hydrogen based cleaning processes.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of cleaning a lithography optic component, comprising:
   producing $H_2O_2$ vapor from a solution comprising 1% to 30% of $H_2O_2$ in water:
   supplying said $H_2O_2$ vapor into a chamber under vacuum containing a lithography optic component, said lithography optic component including a surface having a residue deposited thereon, said residue including organic compounds and graphitic carbon;
   exposing said $H_2O_2$ vapor to electromagnetic radiation having a wavelength within a range of 100 nm to 350 nm to form hydroxyl radicals;
   oxidizing said residue with said hydroxyl radicals to form volatile organic compounds; and
   removing said volatile organic compounds from said lithography optic component;
   wherein said chamber is at a chamber temperature greater than or equal to 100° C.

2. The method of claim 1, wherein said chamber is at a chamber temperature is in a range of 100° C. to 150° C.

3. The method of claim 1, wherein said wavelength is in a range of 100 nm to 220 nm.

4. The method of claim 1, wherein said chamber has a pressure in a range of $10^{-4}$ to $10^{-1}$ Torr.

5. The method of claim 1, wherein said $H_2O_2$ vapor is supplied into said chamber at a flow rate of 5 sccm to 100 sccm.

6. The method of claim 1, wherein said electromagnetic radiation is provided at a dosage in a range of 5 J/cm$^2$ to 140 J/cm$^2$.

7. The method of claim 1, wherein said lithography optic component exhibits an etch rate of less than 5 nm/minute relative to the hydroxyl radicals.

8. The method of claim 1, wherein said lithography optic component comprises an extreme ultraviolet lithography mask.

9. A method of cleaning a lithography optic component, comprising:
   producing $H_2O_2$ vapor from a solution comprising 1% to 30% by weight of $H_2O_2$ in water,
   contacting a lithography optic component having a residue disposed on a surface thereof with the $H_2O_2$ vapor, wherein said residue includes organic compounds and graphitic carbon;
   irradiating said $H_2O_2$ vapor with electromagnetic radiation having a wavelength in a range of 100 nm to 350 nm; and
   removing said residue from said surface of said lithography optic component;
   wherein said contacting occurs in a chamber having a chamber temperature greater than or equal to 100° C.

10. The method of claim 9, wherein said chamber temperature is in a range of 100° C. to 150° C.

11. The method of claim 9, wherein upon irradiating said $H_2O_2$ vapor, said $H_2O_2$ vapor forms hydroxyl radicals and said hydroxyl radicals oxidize said residue.

12. The method of claim 9, wherein said wavelength is in a range of 100 nm to 220 nm.

13. The method of claim 9, wherein said electromagnetic radiation is provided at a dosage in a range of 5 J/cm$^2$ to 140 J/cm$^2$.

14. The method of claim 9, wherein said lithography optic component comprises Ti-doped fused silica.

15. The method of claim 9, wherein said lithography optic component comprises one or more of the following: Ru, MoSi, CrN, TaNO/TaBO, TaNO/TaN, SiCN, SiON, TiN, TaN and HfO.

16. The method of claim 9, wherein said lithography optic component comprises an extreme ultraviolet lithography mask.

17. The method of claim 11, wherein said lithography optic component exhibits an etch rate of less than 5 nm/minute relative to the hydroxyl radicals.

\* \* \* \* \*

UNITED STATES PATENT AND TRADEMARK OFFICE
CERTIFICATE OF CORRECTION

PATENT NO. : 8,764,905 B1  
APPLICATION NO. : 13/827611  
DATED : July 1, 2014  
INVENTOR(S) : Paul A. Zimmerman et al.

Page 1 of 2

It is certified that error appears in the above-identified patent and that said Letters Patent is hereby corrected as shown below:

IN THE DRAWINGS:

FIG. 4

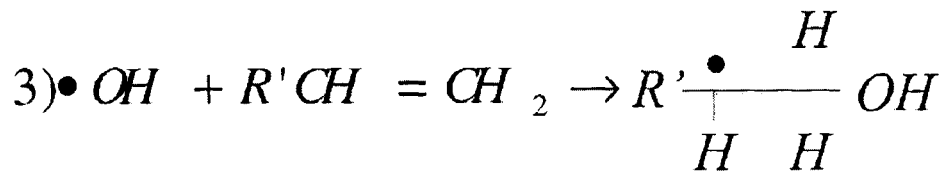

Delete "
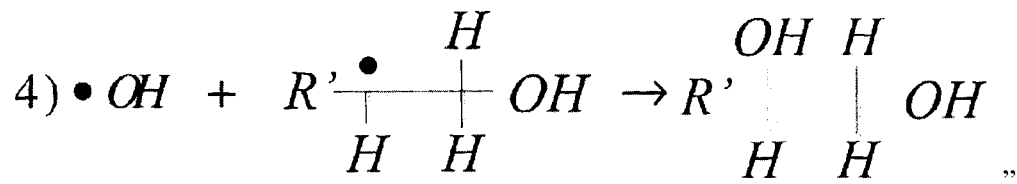
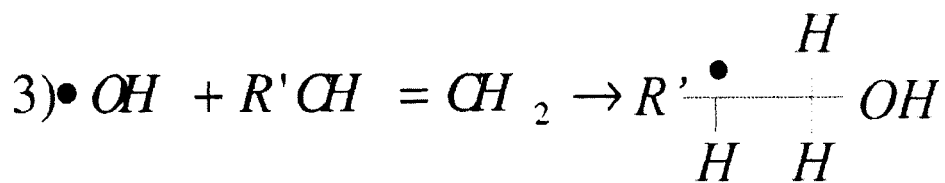
"

and insert --
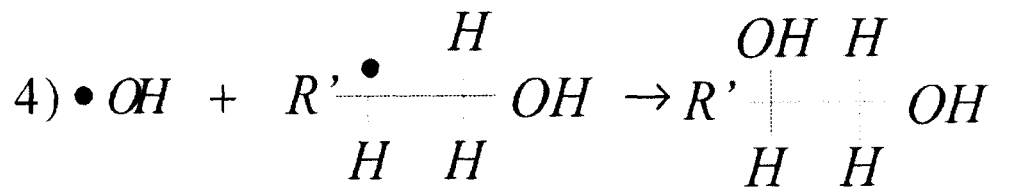
--, therefor.

Signed and Sealed this  
Twenty-fifth Day of November, 2014

Michelle K. Lee  
*Deputy Director of the United States Patent and Trademark Office*

CERTIFICATE OF CORRECTION (continued)
U.S. Pat. No. 8,764,905 B1

IN THE CLAIMS:

In column 9, line 39, in claim 1, delete "water:" and insert -- water; --, therefor.

In column 10, line 21, in claim 9, delete "water," and insert -- water; --, therefor.